United States Patent
Stark

(10) Patent No.: US 8,225,471 B2
(45) Date of Patent: Jul. 24, 2012

(54) INJECTION MOLDED ENERGY HARVESTING DEVICE

(75) Inventor: Brian Stark, San Francisco, CA (US)

(73) Assignee: Robert Bosch GmbH, Stuttgart (DE)

(*) Notice: Subject to any disclaimer, the term of this patent is extended or adjusted under 35 U.S.C. 154(b) by 80 days.

(21) Appl. No.: 12/789,405

(22) Filed: May 27, 2010

(65) Prior Publication Data
US 2010/0236036 A1 Sep. 23, 2010

Related U.S. Application Data

(62) Division of application No. 11/354,399, filed on Feb. 14, 2006, now abandoned.

(51) Int. Cl.
*H01L 41/22* (2006.01)
(52) U.S. Cl. ............ 29/25.35; 29/827; 29/830; 29/831; 29/832; 29/852
(58) Field of Classification Search ........... 29/25.35, 29/827, 830, 831, 832, 841, 846; 310/330, 310/339, 329, 348, 332; 257/666, 667, 686, 257/787, 698, 295
See application file for complete search history.

(56) References Cited

U.S. PATENT DOCUMENTS

| | | | |
|---|---|---|---|
| 3,456,134 A | 7/1969 | Ko | |
| 3,899,305 A * | 8/1975 | Hilgers et al. | 428/593 |
| 4,532,451 A | 7/1985 | Inoue | |
| 5,327,104 A * | 7/1994 | Kikushima | 331/68 |
| 5,631,609 A * | 5/1997 | Oka et al. | 331/68 |
| 5,724,259 A * | 3/1998 | Seymour et al. | 382/199 |
| 5,841,187 A * | 11/1998 | Sugimoto et al. | 257/666 |
| 5,912,524 A | 6/1999 | Ohnishi et al. | |
| 5,929,432 A * | 7/1999 | Yamakawa | 250/208.1 |
| 6,078,126 A | 6/2000 | Rollins et al. | |
| 6,244,110 B1 | 6/2001 | Takeuchi et al. | |
| 6,386,669 B1 * | 5/2002 | Scofield et al. | 347/14 |
| 6,590,315 B2 | 7/2003 | Beaver | |
| 6,744,181 B1 | 6/2004 | Ogiura et al. | |
| 6,762,485 B2 | 7/2004 | Jiang et al. | |

(Continued)

FOREIGN PATENT DOCUMENTS
EP 1598219 A2 11/2005
(Continued)

OTHER PUBLICATIONS

Notification of Transmittal of the International Search Report and the Written Opinion of the International Searching Authority, or the Declaration, Jul. 5, 2007, pp. 1-16.
"EoPlex Plans to Print Fuel Cells" Fuel Cells Bulletin, Elsevier Advanced Technology Kidlington, GB, vol. 2006, No. 7, Jul. 1, 2006, p. 5.
"Reinventing the Wheel" IEEE Spectrum, IEEE Inc. New York, US, vol. 45, No. 2, Feb. 1, 2008, p. 15.

(Continued)

*Primary Examiner* — Derris H Banks
*Assistant Examiner* — Tai Nguyen
(74) *Attorney, Agent, or Firm* — Dergosits & Noah LLP; Geoffrey T. Staniford

(57) ABSTRACT

Embodiments of an injection molded energy harvesting device are described. In one embodiment, a piezoelectric cantilever is produced via an injection molding method to harvest vibration energy from an environment being sensed. The cantilever device consists of a piezoelectric material member, a proof mass of high density material coupled to the piezoelectric member, and a leadframe for electrical connection. The piezoelectric member is electrically attached to the leadframe with a standard connecting material. The entire assembly is then injection molded with plastic. The plastic encased piezoelectric member forms a cantilever that generates electricity in response to vibration exerted on the proof mass.

10 Claims, 9 Drawing Sheets

U.S. PATENT DOCUMENTS

| | | |
|---|---|---|
| 6,917,142 B2 | 7/2005 | Koyama et al. |
| 6,938,311 B2 | 9/2005 | Tanielian |
| 7,116,036 B2 | 10/2006 | Balasubramaniam et al. |
| 7,302,068 B2 | 11/2007 | Longbottom et al. |
| 7,367,232 B2 | 5/2008 | Vaganov et al. |
| 7,504,763 B2 | 3/2009 | Haswell et al. |
| 7,737,608 B2 | 6/2010 | Ruggeri et al. |
| 2006/0021261 A1 | 2/2006 | Face |
| 2007/0125176 A1 | 6/2007 | Liu |

FOREIGN PATENT DOCUMENTS

| | | |
|---|---|---|
| EP | 1841053 A1 | 10/2007 |
| JP | 63-74312 | 4/1998 |
| WO | 2004078463 A1 | 9/2004 |
| WO | 2005067073 A1 | 7/2005 |

OTHER PUBLICATIONS

Roundy, S.J., "Energy Scavenging for Wireless Sensor Nodes with a Focus on Vibration to Electricity Conversion", A Dissertation Submitted in Partial Satisfaction of the Requirements for the Degree of Doctor in Philosophy in Engineering—Mechanical Engineering, The University of California, Berkeley, California, US, Spring 2003, pp. 1-297.

Du Plessis, A.J., et al., "Resonant Packaged Piezoelectric Power Harvester for Machinery Health Monitoring", Proceedings of the SPIE—The International Society for Optical Engineering SPIE-INT., Soc. Opt. Eng USA, vol. 5762, No. 1, pp. 224-235.

Notification of Transmittal of the International Search Report and the Written Opinion of the International Searching Authority, or the Declaration, Sep. 19, 2007, pp. 1-12.

* cited by examiner

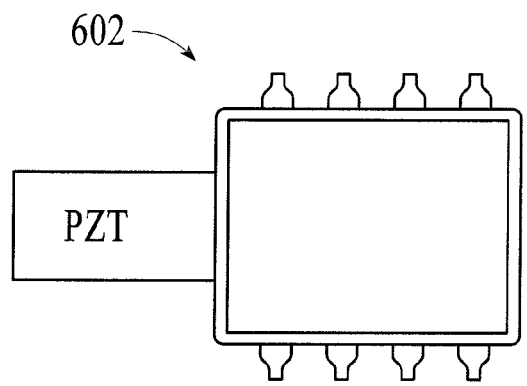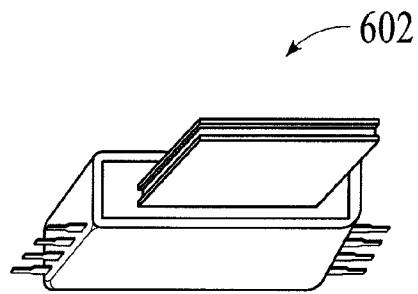
FIG.6A  FIG.6B
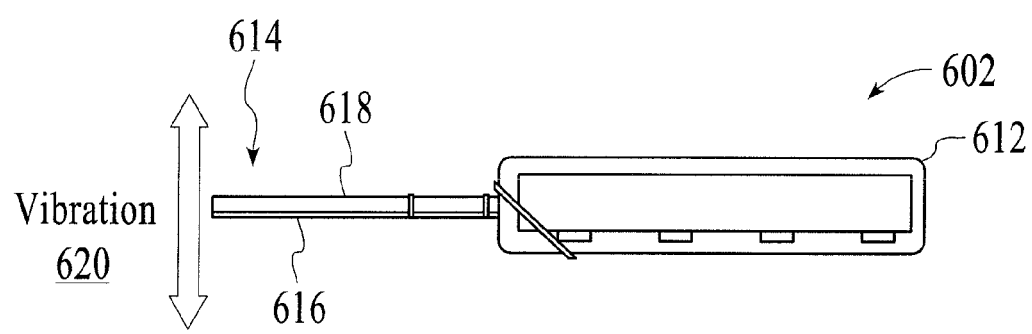
FIG.6C

INJECTION MOLDED ENERGY HARVESTING DEVICE

CROSS-REFERENCE TO RELATED APPLICATIONS

This application is a divisional application of, and claims priority from U.S. patent application Ser. No. 11/354,399 entitled "Injection Molded Energy Harvesting Device," filed Feb. 14, 2006, and which is hereby incorporated by reference in its entirety.

FIELD

Embodiments of the invention relate generally to miniaturized electrical systems, and specifically to injection molded devices for harvesting energy.

BACKGROUND

The use of miniaturized electrical systems (microsystems) on the order of 1 cc has been proposed to provide distributed sensing capability. Microsystem sensors can be used to monitor various environmental and operational conditions and transmit signals back to a host receiver for many different applications, such as industrial monitoring, security applications, weather prediction, and so on. The design and implementation of such devices and systems requires overcoming several challenges, such as designing small and robust packaging and providing adequate transmitter power. A major consideration in designing such systems remains providing adequate electrical power, and for many microsystems, this challenge remains a significant obstacle. In general, current miniature battery technologies cannot store enough energy to power these systems for long periods of time, such as on the order of months. Another disadvantage of battery use is that many sensor applications involve harsh or limited access environments that can limit or disable battery performance and/or render battery maintenance virtually impossible.

One approach to overcome the problem of providing enough battery power for microsystems is to extract energy from the surrounding environment. This approach, which is called energy harvesting (or scavenging) eliminates the need for an external or stored power supply, thus allowing a system to be made fully autonomous, that is, one that requires no external power connections or maintenance. As long as the source of environmental energy is available, an energy harvesting microsystem can remained fully powered, virtually non-stop, while providing information to the user.

Several techniques have been proposed and developed to extract energy from the environment. The most common available sources of energy are vibration, temperature, and stress (pressure). In many environmental applications, vibration energy may be the most readily available and easiest to convert into electricity. In general, vibration energy can be converted into electrical energy using one of three techniques: electrostatic charge, magnetic fields, and piezoelectric materials. Piezoelectric generation of electricity from vibration energy typically represents the most cost-effective approach, as the electrostatic and magnetic techniques usually require more extensive design, packaging, and integration work to adapt to particular applications.

INCORPORATION BY REFERENCE

Each publication, patent, and/or patent application mentioned in this specification is herein incorporated by reference in its entirety to the same extent as if each individual publication and/or patent application was specifically and individually indicated to be incorporated by reference.

BRIEF DESCRIPTION OF THE DRAWINGS

Embodiments of the present invention are illustrated by way of example and not limitation in the figures of the accompanying drawings, in which like references indicate similar elements and in which:

FIG. 6A illustrates top view of an individual piezoelectric device formed by cutting the lead frame rails, under an embodiment.

FIG. 6B illustrates a front view of the piezoelectric device of FIG. 6A.

FIG. 6C illustrates a side view of the piezoelectric device of FIG. 6A.

DETAILED DESCRIPTION

Embodiments of an injection molded energy harvesting device are described. In one embodiment, a piezoelectric cantilever is produced via an injection molding method to harvest vibration energy from an environment being sensed. The cantilever device consists of a piezoelectric material member, a proof mass of high density material coupled to the piezoelectric member, and a leadframe for electrical connection. The piezoelectric member is electrically attached to the leadframe with a standard connecting material. The entire assembly is then injection molded with plastic. The plastic encased piezoelectric member forms a cantilever that generates electricity in response to vibration exerted on the proof mass. Such a device can be used to provide power to sensor systems deployed in various vibration intensive environments, such as tire pressure monitoring systems, seismic systems, and the like.

In the following description, numerous specific details are introduced to provide a thorough understanding of, and enabling description for, embodiments of an injection molded energy harvesting device. One skilled in the relevant art, however, will recognize that these embodiments can be practiced without one or more of the specific details, or with other components, systems, and so on. In other instances, wellknown structures or operations are not shown, or are not described in detail, to avoid obscuring aspects of the disclosed embodiments.

Microsystem sensors can be used in a variety of different environments to provide signals that represent one or more characteristics or parameters of the environment being sensed. One critical consideration in the installation of microsystems is providing power to the sensor. Many environments in which microsystem sensors are deployed either produce or are subject to vibrations. In one embodiment, an energy harvesting device uses vibration energy present in an environment being sensed to produce electricity to power the sensor.

Figure 1:
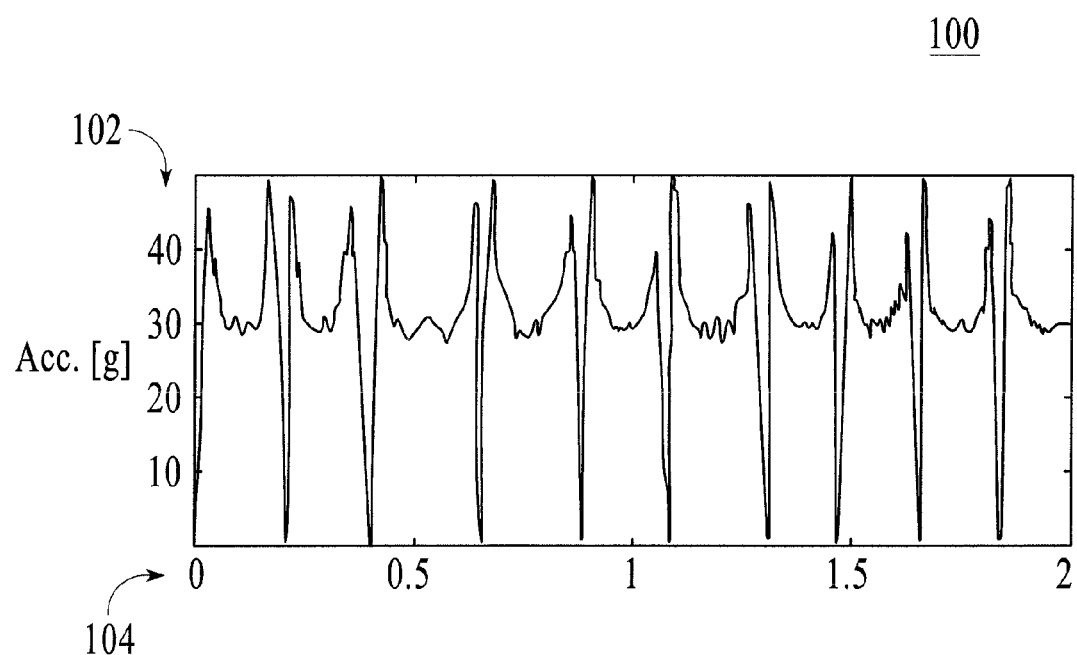
FIG. 1 illustrates vibration energy, such as in a rotating tire that can be used in an energy harvesting device according to an embodiment.

Automotive applications represent one field where vibration energy from motion of the vehicle in use is readily present and can be used to provide power to sensor networks in a car. In one embodiment, an energy harvesting device is used in a tire pressure sensing module that is deployed inside of an automobile, truck or other vehicle or machine tire to sense the air pressure inside of the tire and transmit the air pressure information to a control or processor module that can report low or abnormal tire pressures. The rubber carcass of a tire as it rolls along a surface produces vibrations that can be converted into electrical energy. FIG. 1 is a graph 100 that illustrates the acceleration in tire rubber as the tire rolls at a specific speed, such as 30 kilometers/hour. The accelerative force (in g's) along axis 102 is plotted against time (in seconds) 104 to A pressure sensor mounted within the tire, such as embedded within or coupled to the wheel or tire carcass can be used to monitor the pressure inside the tire. For this application, the use of a battery is impractical because the battery size and weight may impact the tire balance, excessively cold or warm temperatures within the tire can significantly affect battery performance, and replacement and disposal of the battery may be impractical or costly. In one embodiment, a piezoelectric cantilever or bender structure is used to provide the requisite energy to the tire pressure sensor. The piezoelectric bender converts the accelerative forces, such as those shown in FIG. 1, of the tire as it rolls into electricity for powering the pressure sensor.

In one embodiment, the energy harvesting device for use with a tire pressure sensor comprises a piezoelectric bender that includes a piezoelectric bimorph structure. Piezoelectric materials are materials that convert vibration energy into electric energy. A single piece of piezoelectric material by itself is generally a unimorph structure that exhibits stress in equal and opposite directions under transverse loading. Consequently, the output voltage will be zero in the case of a sinusoidal vibration input. A bimorph structure has stress in one direction under a transverse load, and therefore outputs a non-zero voltage under the application of sinusoidal vibration. To provide adequate power output in a wide variety of different vibrating environments, a bimorph structure is generally preferred.

Figure 2A:
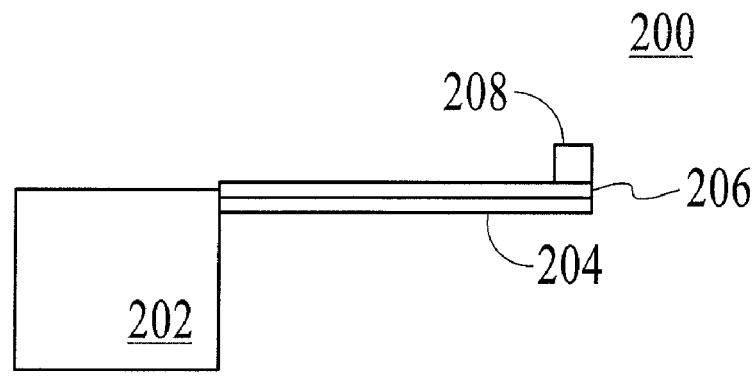
FIG. 2A illustrates a piezoelectric bimorph for use in an energy harvesting device, according to an embodiment.

FIG. 2A illustrates a piezoelectric bender for use in an energy harvesting device and utilizing a piezoelectric bimorph structure, according to an embodiment. The piezoelectric bender 200 consists of a plastic base 202, a plastic backing piece 204 coupled to the plastic base 202, a piezoelectric element 206 attached to the plastic backing 204, and a proof mass 208 attached to the piezoelectric element 206. The proof mass could alternatively be attached to the plastic backing 204. The piezoelectric element 206 and plastic backing piece 204 together form the piezoelectric bimorph structure of the bender 200. When a vibration force is induced onto bender structure 200, the bimorph strip consisting of backing 204 and piezoelectric material 206 is deflected with a motion proportional to the vibration force. This deflection is converted into electrical power, amplified, and then transmitted to other circuitry, such as that in a sensor coupled to structure 200. In one embodiment, the piezoelectric material is Lead Zirconate Titanate (PZT), such as a PZT-5A type ceramic, and the proof mass is Tungsten. The body 202 and backing material 204 can be made of plastic or any similar inactive material, such as carbon fiber, nylon, and so on.

In an alternative embodiment, the bimorph strip can be implemented as a piezo/metal or piezo/piezo element, or a piezo stack comprising three or more elements in a sandwich array.

Figure 2B:
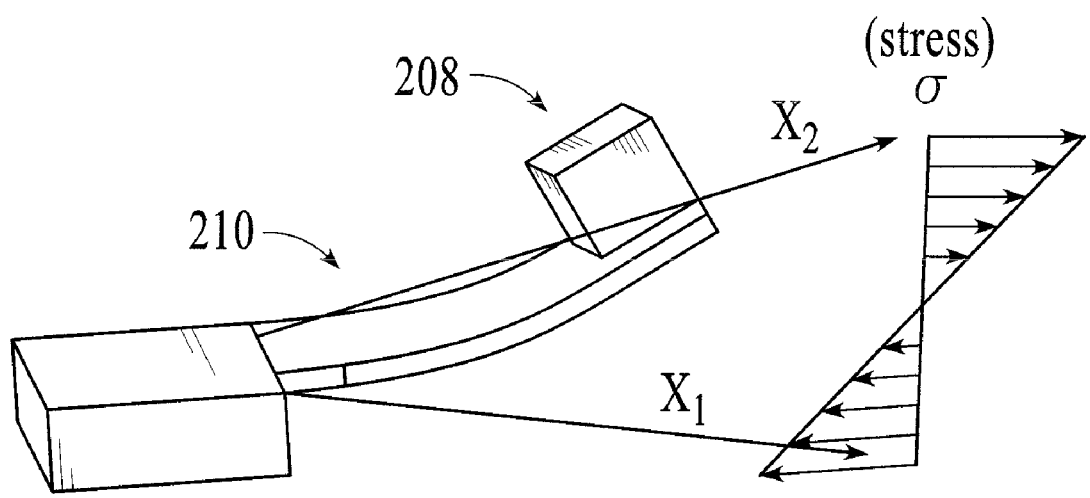
FIG. 2B illustrates the piezoelectric bimorph of FIG. 2A under a transverse loading.

FIG. 2B illustrates the piezoelectric bimorph of FIG. 2A under a transverse loading input, such as the vibration illustrated in FIG. 1. As illustrated in FIG. 2B, the piezoelectric bender 200 bends from a first position $x_1$ to a second position $x_2$, the amount of stress c produced depends on the displacement of the proof mass from the first position to the second position. For an oscillating transverse input, such as a vibration, the piezo/plastic bimorph 210 will bend in the direction corresponding to the phase of the vibration, thus producing a positive stress value dependent on the magnitude of displacement caused by the transverse load. The PZT material of the bimorph integrates the stress to produce a power output. The proof mass serves to increase the stress force since the force is proportional to the mass of the bimorph strip and the induced acceleration.

Figure 3:
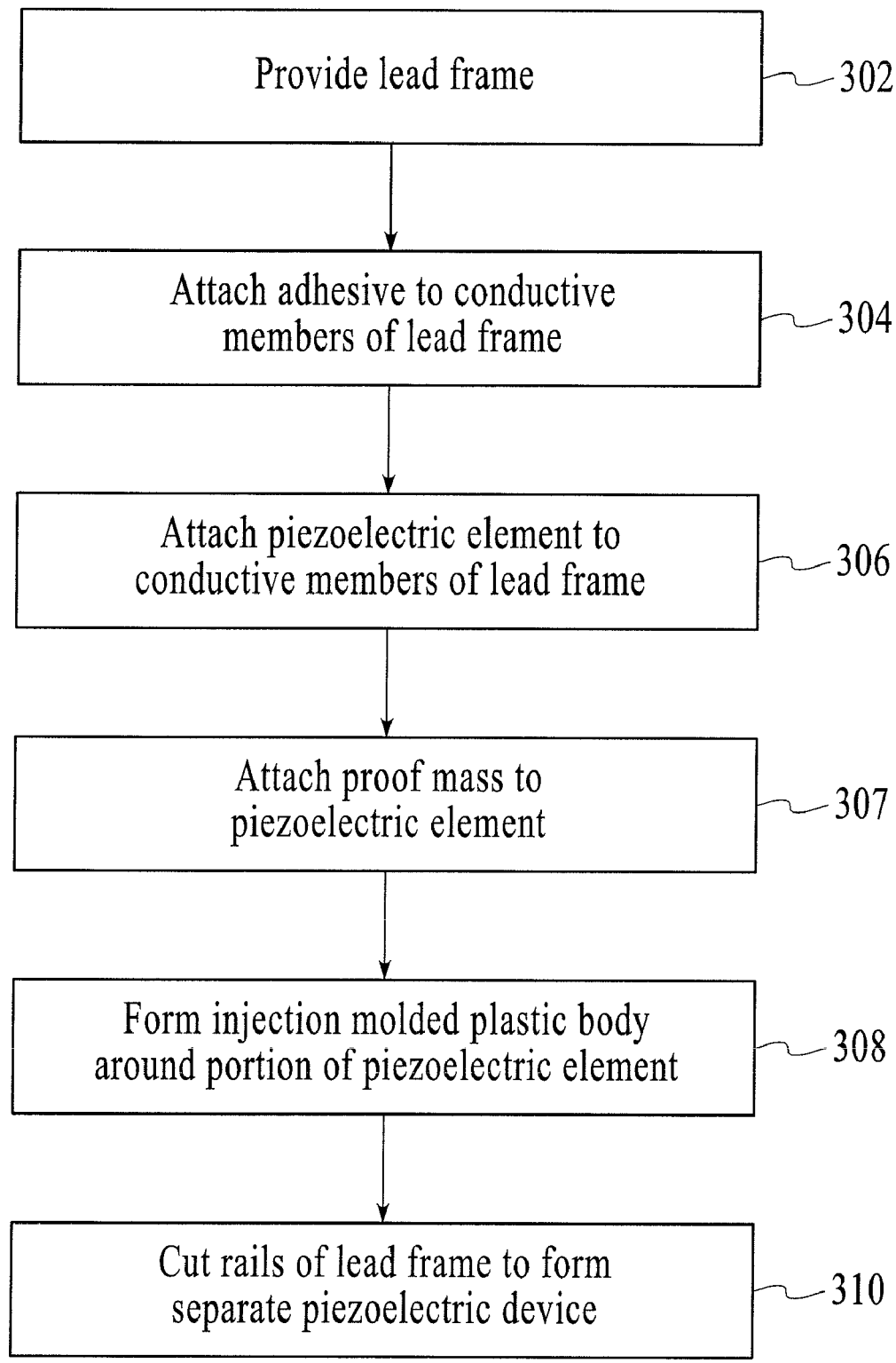
FIG. 3 is a flowchart that illustrates a method of manufacturing an injection molded energy harvesting device, according to an embodiment.
Figure 4:
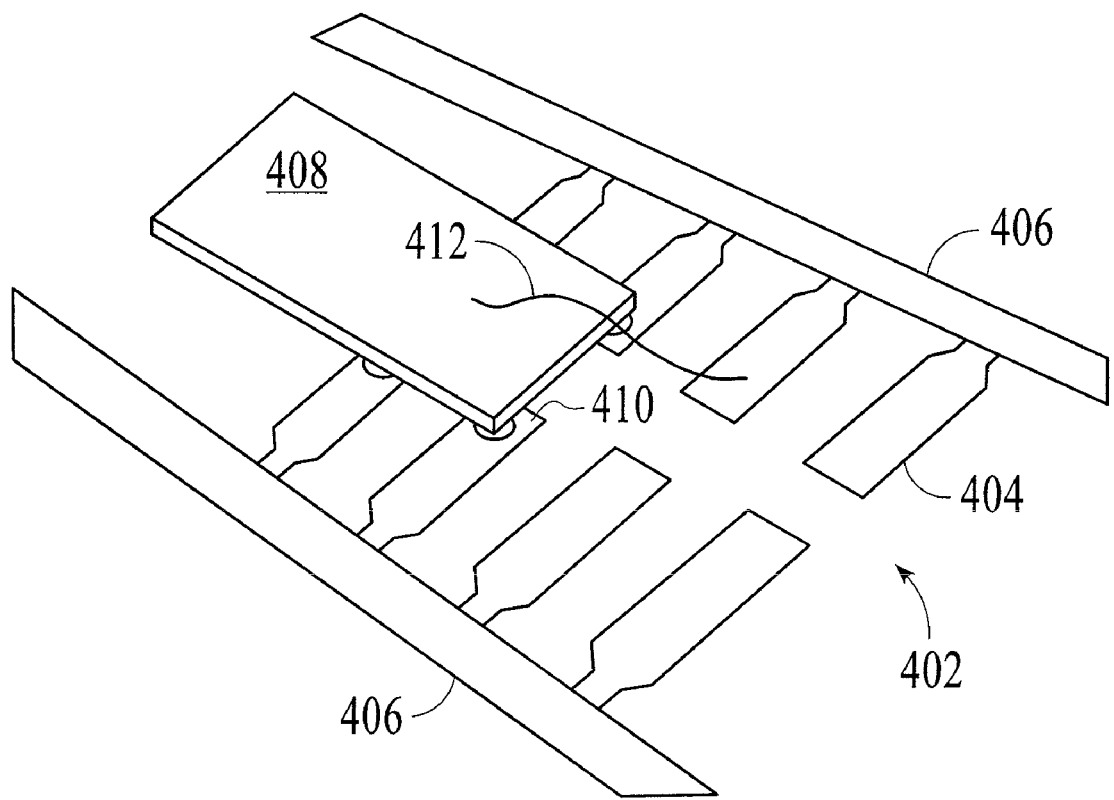
FIG. 4 illustrates a piezoelectric element attached to a leadframe, under an embodiment.

In one embodiment, the piezoelectric bender is constructed using plastic injection molding and leadframe construction techniques to facilitate cost-effective manufacture. FIG. 3 is a flowchart that illustrates a method of manufacturing an injection molded energy harvesting device, according to an embodiment. Manufacture of the piezoelectric bender under this embodiment begins with arrangement of an appropriate leadframe 302. Conductive epoxy, or a similar adhesive is then applied to the conductive members of the lead frame to which a piezoelectric element is to be attached, 304. The piezoelectric element is then attached to the appropriate conductive members of the leadframe, as shown in block 306 of FIG. 3. FIG. 4 illustrates a piezoelectric element attached to a leadframe, under an embodiment. The leadframe 402 consists of a number of conductive members 404 attached to rails 406. The piezoelectric member 408 is attached to one or more (e.g., two pairs) of the conductive members through conductive epoxy or similar adhesive means 410. A wirebond 412 may be provided to connect the piezoelectric member 408 to an additional conductive member. Once the body of the device has been formed, the conductive members constitute leads that extend from the body and provide electrical and mechanical contact points.

Depending upon the vibrational environment the piezoelectric device is subject to, a proof mass may need to be attached to the piezoelectric bimorph. In one embodiment, a proof mass, such as proof mass 208 in FIG. 2A, is attached to the piezoelectric member, as shown in block 307 of FIG. 3. A proof mass generally provides force amplification for the piezoelectric bender, and may be needed when the incident accelerative forces are relatively small.

Figure 5:
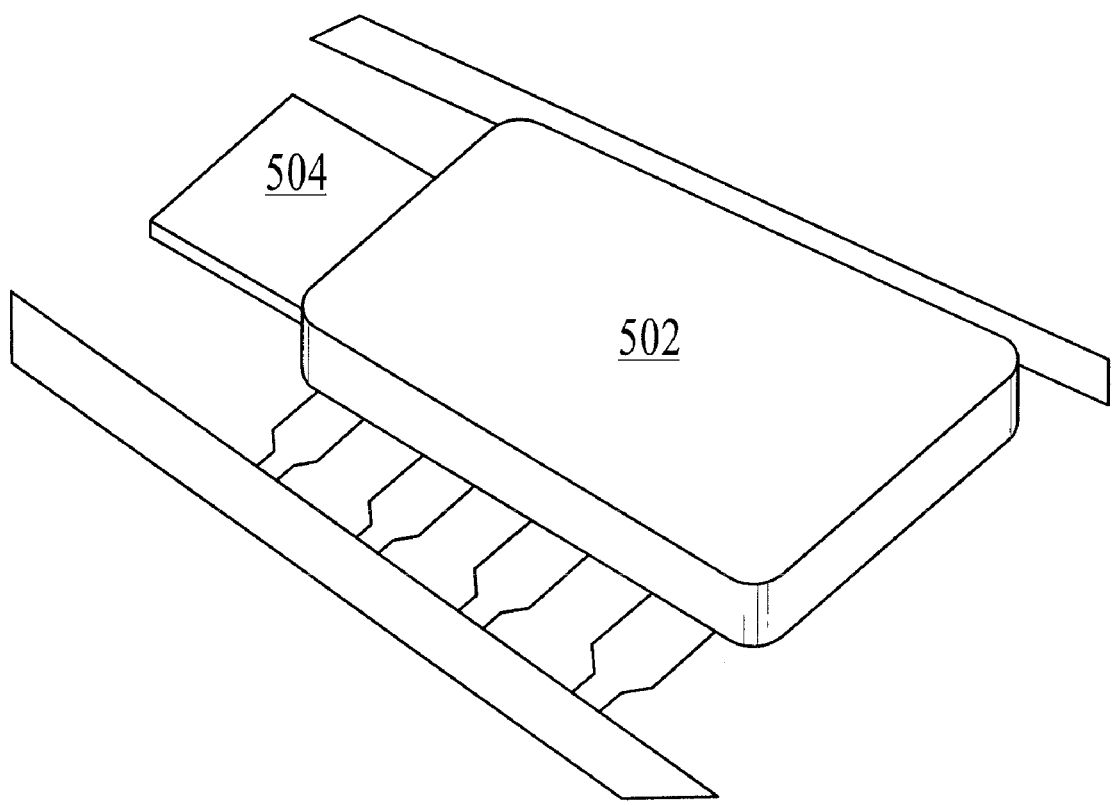
FIG. 5 illustrates an injection molded plastic body encasing the piezoelectric/leadframe structure of FIG. 4, according to an embodiment.

Once the piezoelectric member is attached to the lead frame conductors, and any proof mass is attached to the piezoelectric member, the structure is partially encased plastic using an injection mold process, as shown in block 308 of FIG. 3. FIG. 5 illustrates an injection molded plastic body encasing the piezoelectric/leadframe structure of FIG. 4, according to an embodiment. As shown in FIG. 5, the injection molded plastic body 502 encases a portion of the piezoelectric element, while a protruding portion 504 of the piezoelectric material remains exposed. Once the injection molded body has been formed around the piezoelectric element, the rails are cut away from the connecting members to expose the contact leads and produce an individual piezoelectric device, as shown in block 310 of FIG. 3. FIG. 6A illustrates top view of an individual piezoelectric device 602 formed by cutting the lead frame rails, under an embodiment. FIG. 6B illustrates a front view of the piezoelectric device of FIG. 6A, and FIG. 6C illustrates a side view of the piezoelectric device of FIG. 6A. As shown in FIG. 6C, the piezoelectric device 602 comprises a body portion 612 and a plastic/piezo bimorph element 614 that consists of a plastic backing 616 and piezo element 618. The orientation of the bimorph structure illustrated in FIG. 6C results in a device that responds to vibrations 620 in an up and down direction relative to the body 612.

For the embodiment illustrated in FIG. 6C, the bimorph element (or strip) 614 is a piezo material mounted on plastic. Alternatively, the bimorph element may also be fabricated from two PZT elements bonded together, or a PZT element bonded to a different material, such as part of the lead frame itself.

Figure 7:
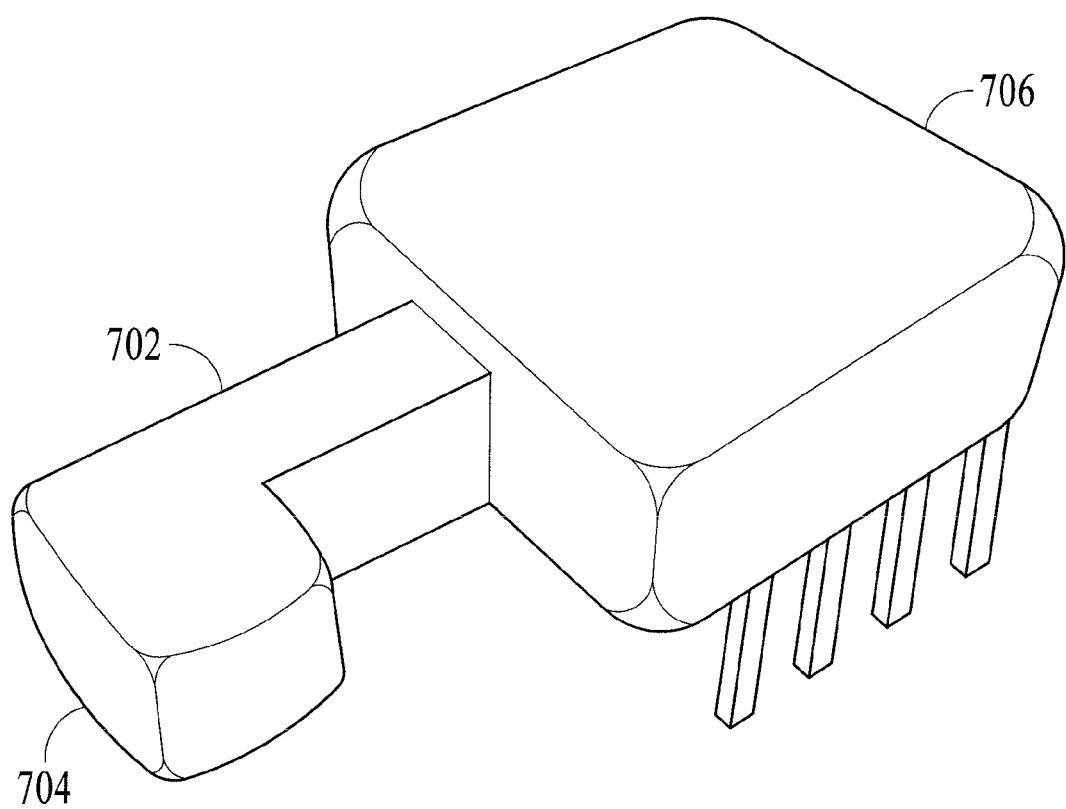
FIG. 7 illustrates a piezoelectric device with a proof mass attached, according to an embodiment.

In one embodiment, the proof mass is attached to the exposed portion of piezoelectric element and is left exposed after the injection molding process 308. Alternatively, the proof mass can be also be encased within the injection molded plastic body. FIG. 7 illustrates a piezoelectric device with a proof mass attached, according to an embodiment in which the proof mass is also molded over with plastic. The encasing and orientation of the proof mass relative to the bimorph element can be specifically configured depending upon the application requirements of the energy harvesting device. For the embodiment illustrated in FIG. 7, the orientation of the bimorph structure 702 formed by the exposed piezoelectric material and plastic backing is perpendicular to the horizontal plane of the body 706. This results in a piezoelectric device that responds to vibrations in a side-to-side direction relative to the body 706. The proof mass 704 attached to the bimorph structure 702 provides force amplification for the piezoelectric bender. It may be attached to one side of the surface of either the piezoelectric or plastic side of the bimorph structure, or it may be attached to the end of the bimorph structure. The size, weight, material, and placement of the proof mass can be adjusted according to the requirements of the environment in which the piezoelectric device is used.

Figure 8:
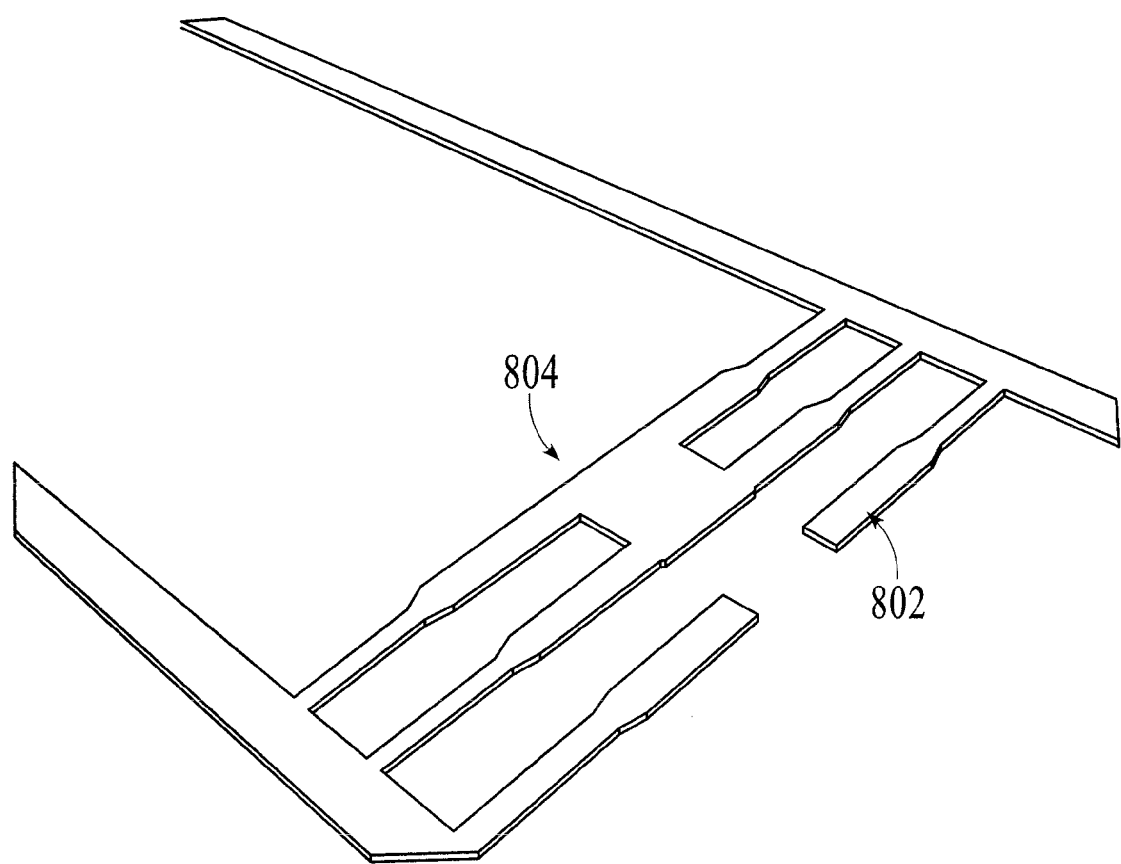
FIG. 8 illustrates a lead frame with a die paddle for use with a piezoelectric bender, according to an embodiment.

Various different types of leadframes can be used in conjunction with embodiments of the piezoelectric bender. Standard lead frames, such as that shown in FIG. 3 may be used. Alternatively, a lead frame with a die paddle may be used. FIG. 8 illustrates a lead frame with a die paddle for use with a piezoelectric bender, according to an embodiment. In a die paddle arrangement, one or more pairs of leads 802 are coupled to each other through a die paddle connection 804.

Figure 9:
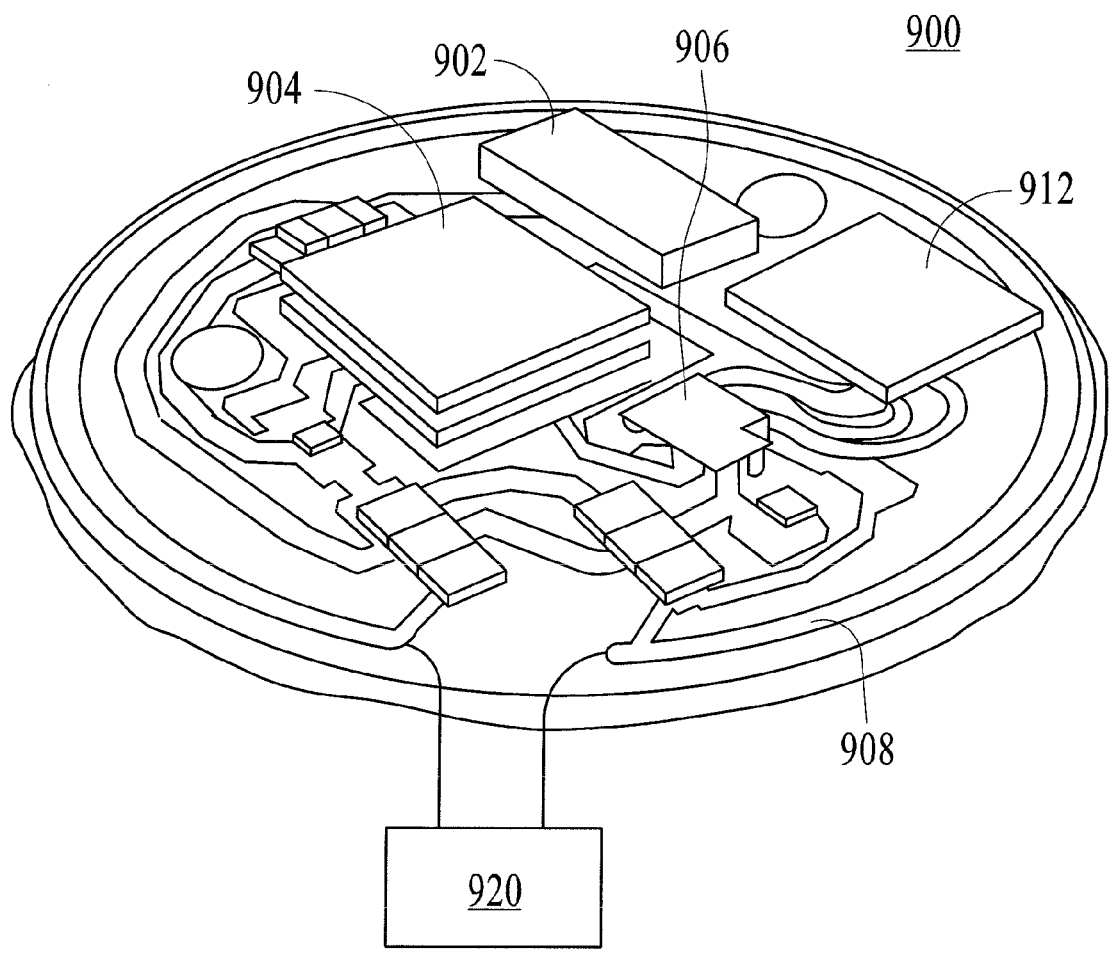
FIG. 9 illustrates the sensor/transmitter circuit of an intelligent tire system for use with an injection molded energy harvesting device, under an embodiment.

An energy harvesting device utilizing a bimorph piezoelectric bender in an injection molded body can be used in various different applications that have long-term energy requirements. In one embodiment, the piezoelectric bender is used in an intelligent tire system to provide power to a circuit that comprises a pressure sensor and transmitter circuit for mounting within the wheel or rubber portion of the tire. FIG. 9 illustrates the sensor/transmitter circuit of an intelligent tire system for use with an injection molded, piezoelectric energy harvesting device, under an embodiment. Circuit 900 consists of a pressure sensor module 902, an oscillator 904, and a transmitter circuit 906. The transmitter may be an RF based transmitter, in which case, a surface mount antenna 908 may be provided. The shape of the circuit 900 may be circular, as shown, or any other suitable shape, depending upon application. Other sensor circuits 912 can also be provided to monitor other characteristics, such as tire air composition, temperature, and so on. A piezoelectric bender 920 coupled to circuit 900 converts vibration energy from the rolling tire to electricity and provides this power to the circuit. The piezoelectric bender may be provided on a separate circuit or unit that is coupled to the sensor circuit, or it may be incorporated on or tightly coupled to circuit 900. The entire circuit 900 illustrated in FIG. 9 may be on the order of 10 mm, or less, in diameter, with the piezoelectric bender 920 on the order of 5 mm, or less, in length.

Although embodiments have been described in relation to a tire pressure sensor system, it should be understood that these or similar embodiments, can be utilized with respect to a wide variety of other microsystems involving sensors or devices that require and can operate at relatively low power. These include motion sensors, infrared sensors, leak detectors, lubricant monitors, and other applications that have a characteristic that can be measured and feature a vibrating environment. For example, sensors using an injection molded piezoelectric bender for electrical power can be mounted within a vehicle fuel tank to monitor fuel quantity or quality, or within an engine crankcase to monitor oil quantity and quality. Embodiments of injection molded energy harvesting device can be applied to many different industries, such as automotive or aerospace applications, industrial machinery, seismic applications, and oceanographic applications, among others.

The sensors used in conjunction with the injection molded energy harvesting device can be equipped with any suitable sensing and transmission circuitry, such as RF, microwave, or similar wireless communication means. Alternatively, some applications may be suitable for wired sensor communication.

Aspects of the injection molded energy harvesting device described herein may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the energy harvesting device for use with microsystem sensors is not intended to be exhaustive or to limit the embodiments to the precise form or instructions disclosed. While specific embodiments of, and examples for, the energy harvesting device are described herein for illustrative purposes, various equivalent modifications are possible within the scope of the described embodiments, as those skilled in the relevant art will recognize.

The elements and acts of the various embodiments described above can be combined to provide further embodiments. These and other changes can be made to the energy harvesting device in light of the above detailed description.

In general, in the following claims, the terms used should not be construed to limit the described system to the specific embodiments disclosed in the specification and the claims, but should be construed to include all operations or processes that operate under the claims. Accordingly, the described system is not limited by the disclosure, but instead the scope of the recited method is to be determined entirely by the claims.

While certain aspects of the energy harvesting device are presented below in certain claim forms, the inventor contemplates the various aspects of the methodology in any number of claim forms. Accordingly, the inventor reserves the right to add additional claims after filing the application to pursue such additional claim forms for other aspects of the described system.

What is claimed is:

1. A method comprising:
   providing a lead frame comprising paired conductive members connected to rail elements;
   attaching adhesive to one or more conductive members of the lead frame;
   attaching a piezoelectric element at least one conductive member of the one or more conductive members of the lead frame;
   attaching a proof mass to a first portion of piezoelectric element;
   forming an injection molded plastic body around a second portion of the piezoelectric element; and
   cutting the rail elements of the lead frame from the plastic body to form separate piezoelectric devices.

2. The method of claim 1, wherein the first portion and second portion of the piezoelectric element are coincident such that the injection molded plastic body is formed around the proof mass.

3. The method of claim 1 further comprising the step of forming a piezo bimorph strip by bonding the first portion of the piezoelectric element to a substrate, the substrate comprising a strip material made of one of the following: plastic, piezoelectric material, and metal.

4. The method of claim 3 further comprising the step of leaving portions of the one or more conductive members of the lead frame exposed from the injection molded plastic body to form electrical contacts.

5. The method of claim 1 further comprising forming the piezoelectric material from Lead Zirconate Titanate (PZT), and forming the proof mass from tungsten.

6. The method of claim 1 wherein the piezoelectric element attached to at least one conductive member form a piezo bimorph element that is configured to deflect in a direction corresponding to a vibration force induced onto the proof mass and generate an electric current in response to the vibration force.

7. The method of claim 6 further comprising:
   containing the plastic body in a circuit component attached to an inner surface of a vehicle tire; and
   providing the electrical current to a sensor component of a tire pressure sensing system.

8. The method of claim 7 wherein the piezo bimorph element provides operating power to the sensor component, the method further comprising:
   providing a transmitter circuit coupled to the sensor circuit; and
   providing an antenna coupled to the transmitter circuit for transmission of tire pressure information.

9. The method of claim 2 further comprising orienting the bimorph element and proof mass relative to the injection molded plastic body such that the direction of movement of the proof mass is vertical to, and moves up-and-down relative to the horizontal plane of the plastic body.

10. The method of claim 2 further comprising orienting the bimorph element and proof mass relative to the injection molded plastic body such that the direction of movement of the proof mass is perpendicular to, and moves side-to-side relative to the horizontal plane of the body.

* * * * *